US012272418B2

(12) United States Patent
Xu et al.

(10) Patent No.: US 12,272,418 B2
(45) Date of Patent: *Apr. 8, 2025

(54) PERFORMING SELECT GATE INTEGRITY CHECKS TO IDENTIFY AND INVALIDATE DEFECTIVE BLOCKS

(71) Applicant: Micron Technology, Inc., Boise, ID (US)

(72) Inventors: Zhongguang Xu, San Jose, CA (US); Zhenlei Shen, Milpitas, CA (US); Murong Lang, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/242,884

(22) Filed: Sep. 6, 2023

(65) Prior Publication Data

US 2023/0420066 A1  Dec. 28, 2023

Related U.S. Application Data

(63) Continuation of application No. 17/550,462, filed on Dec. 14, 2021, now Pat. No. 11,854,644.

(51) Int. Cl.
*G11C 16/34* (2006.01)
*G06F 3/06* (2006.01)
*G11C 29/50* (2006.01)

(52) U.S. Cl.
CPC ...... *G11C 29/50004* (2013.01); *G06F 3/0679* (2013.01)

(58) Field of Classification Search
CPC .............. G11C 23/50004; G06F 3/0679
See application file for complete search history.

(56) References Cited

U.S. PATENT DOCUMENTS

| | | | |
|---|---|---|---|
| 10,707,226 B1 | 7/2020 | Yang | |
| 11,854,644 B2* | 12/2023 | Xu | .......... G06F 3/0679 |
| 2016/0092129 A1 | 3/2016 | Agarwal | |
| 2017/0169897 A1* | 6/2017 | Lee | .......... G11C 16/3459 |
| 2019/0304563 A1 | 10/2019 | Her | |
| 2021/0272645 A1* | 9/2021 | Yoon | .......... G11C 29/38 |
| 2021/0304828 A1 | 9/2021 | Kim | |

* cited by examiner

*Primary Examiner* — Min Huang
(74) *Attorney, Agent, or Firm* — Lowenstein Sandler LLP

(57) ABSTRACT

Systems and methods are disclosed including a memory device and a processing device operatively coupled to the memory device. The processing device can perform operations comprising receiving, from a host system, an enhanced erase command referencing a block; performing a lookup to determine whether the block is marked in a grown bad block (GBB) data structure used to track blocks that have a defective select gate; and responsive to determining that the block is marked in the GBB data structure, discarding the enhanced erase command.

20 Claims, 6 Drawing Sheets

GBB DATA STRUCTURE
410

PERFORMING SELECT GATE INTEGRITY CHECKS TO IDENTIFY AND INVALIDATE DEFECTIVE BLOCKS

RELATED APPLICATION

This application is a continuation of U.S. patent application Ser. No. 17/550,462, filed Dec. 14, 2021, the entire content of which is hereby incorporated by reference.

TECHNICAL FIELD

Embodiments of the disclosure relate generally to memory sub-systems, and more specifically, relate to performing select gate integrity checks to identify and invalidate defective blocks.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
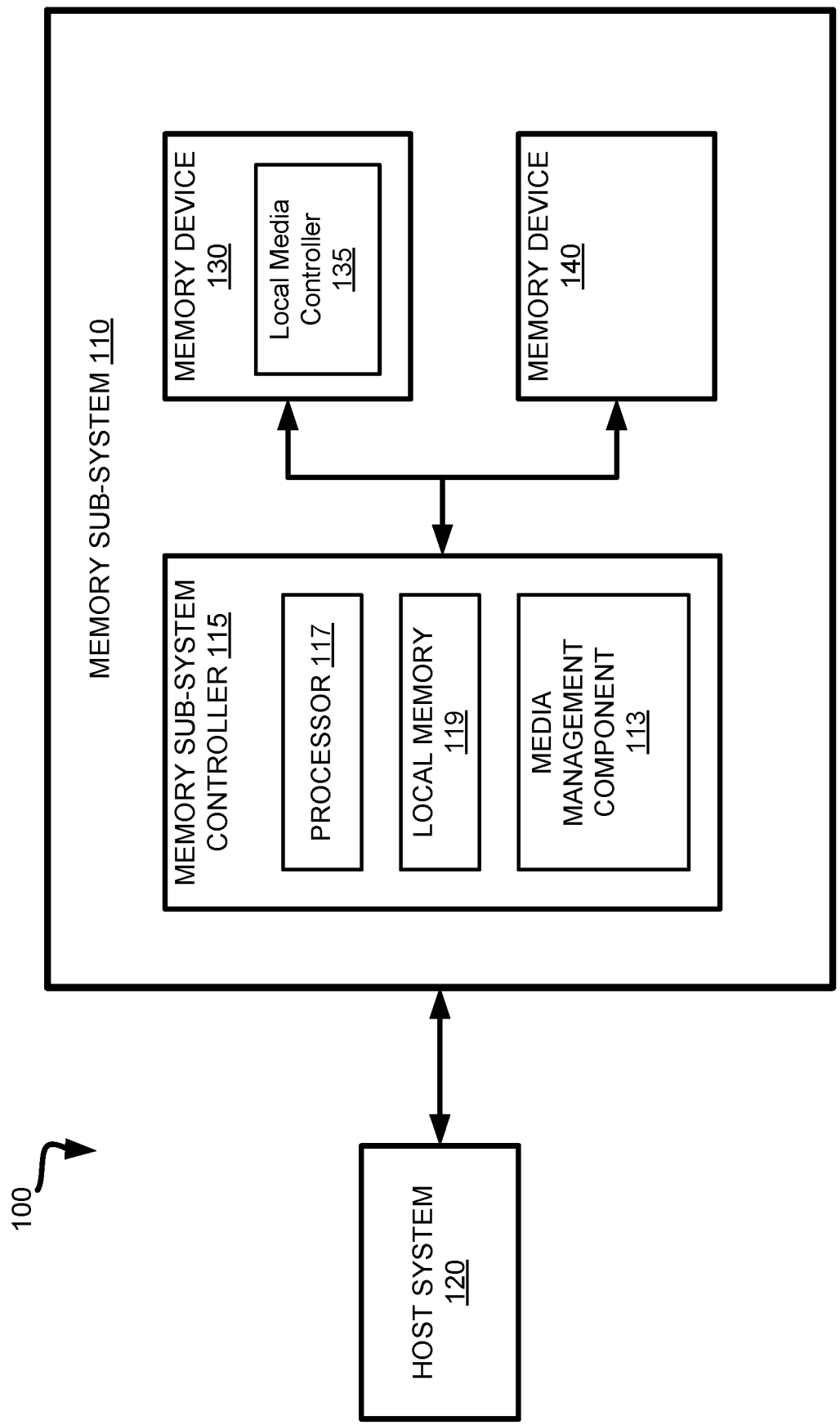
FIG. 1 illustrates an example computing system that includes a memory sub-system in accordance with some embodiments of the present disclosure.

Aspects of the present disclosure are directed to performing data integrity checks to identify and invalidate defective blocks. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can include two or more planes. For some types of non-volatile memory devices (e.g., NAND devices), each plane includes of a set of physical blocks. In some implementations, each block can include multiple sub-blocks. Each plane carries a matrix of memory cells formed onto a silicon wafer and joined by conductors referred to as wordlines and bitlines, such that a wordline joins multiple memory cells forming a row of the matric of memory cells, while a bitline joins multiple memory cells forming a column of the matric of memory cells.

Depending on the cell type, each memory cell can store one or more bits of binary information, and has various logic states that correlate to the number of bits being stored. The logic states can be represented by binary values, such as "0" and "1", or combinations of such values. A memory cell can be programmed (written to) by applying a certain voltage to the memory cell, which results in an electric charge being held by the memory cell, thus allowing modulation of the voltage distributions produced by the memory cell. A set of memory cells referred to as a memory page can be programmed together in a single operation, e.g., by selecting consecutive bitlines.

Precisely controlling the amount of the electric charge stored by the memory cell allows establishing multiple logical levels, thus effectively allowing a single memory cell to store multiple bits of information. A read operation can be performed by comparing the measured threshold voltage ($V_t$) exhibited by the memory cell to one or more reference voltage levels in order to distinguish between two logical levels for single-level cell (SLCs) and between multiple logical levels for multi-level cells. In various embodiments, a memory device can include multiple portions, including, e.g., one or more portions where the sub-blocks are configured as SLC memory and one or more portions where the sub-blocks are configured as multi-level cell (MLC) memory that can store three bits of information per cell and/or (triple-level cell) TLC memory that can store three bits of information per cell. The voltage levels of the memory cells in TLC memory form a set of 8 programming distributions representing the 8 different combinations of the three bits stored in each memory cell. Depending on how they are configured, each physical page in one of the sub-blocks can include multiple page types. For example, a physical page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical page formed from memory cells of the QLC memory type can have a total of four logical pages, where each logical page can store data distinct from the data stored in the other logical pages associated with that physical page A memory array can include access lines, such as wordlines, and data lines, such as bit lines. The wordlines can be connected to global access lines (e.g., global wordlines) in a many-to-one relationship. For some embodiments, the memory array can be formed over a semiconductor that, for example, can be conductively doped to have a conductivity type, such as a p-type conductivity (e.g., to form a p-well), or an n-type conductivity (e.g., to form an n-well). The memory array can be arranged in rows (each corresponding to a wordline) and columns (each corresponding to a bit line). Each column can include a string of series-connected memory cells (e.g., non-volatile memory cells). Each NAND string can be connected (e.g., selectively connected) to a common source. The memory cells can represent non-volatile memory cells for storage of data. The memory cells of each NAND string can be connected, in series, between one or more source select transistors (select gate source) and one or more drain select transistors (select gate drain). The select gate source transistors can be commonly connected to a source select line, and select gates drain transistors can be commonly connected to a drain select line.

When data is written to a memory cell of the memory sub-system for storage, the memory cell can deteriorate. Accordingly, each memory cell of the memory sub-system can have a finite number of write operations performed on the memory cell before the memory cell is no longer able to reliably store data. Data stored at the memory cells of the memory sub-system can be read from the memory sub-system and transmitted to a host system. For example, during a read operation, a read reference voltage is applied to the wordline containing the data to be read, while a pass-through voltage is applied to wordlines of unread memory cells. The pass-through voltage is a read reference voltage higher than any of the stored threshold voltages. As such, when data is written to a memory cell of the memory sub-system for storage, the memory cell can also deteriorate.

Over time, as memory access operations, including write operations, read operations, and erase operations, are repeatedly performed on the blocks of the memory device, certain defects can develop. A "bad block" hereinafter refers to a block that is no longer reliable for storing or retrieving data, for example, due to a defect (e.g., manufacturing defect) or due to wear. A "grown bad block" (GBB) refers to a bad block being unreliable due to wear, which can be determined based on a threshold, e.g., bit error rates (BER) threshold, select gate low voltage threshold, etc.

To protect sensitive data on the memory device, a memory sub-system can perform an enhanced erase operation, such as a sanitize operation. A sanitize operation is an erase operation that erases the specified user data from the non-volatile memory device, the volatile memory device, from any caches or buffers temporarily storing the user data, etc. In particular, each memory cell is raised to an erase voltage (significantly higher than a program voltage), then that signal is dropped to ground, leaving no trace of the previous signal. After this, the memory cell is now in a state where it is ready to be programmed with new data from the host system. Since GBBs can sometimes store readable user data, in some systems, the sanitize operation can be also applied to GBBs storing the specified user data.

However, performing a sanitize operation on a block experiencing a defect can cause a current leakage path to other blocks on the same plane (via one or more wordlines or select lines). Performing a reading on a select gate (e.g., select gate $212_0$ to $212_M$ shown in FIG. 2) can identify defects by detecting whether the threshold voltage at a select gate is significantly lower than the voltage applied to the select line (commonly referred to as select gate low voltage), such as select line 215 shown in FIG. 2. In an example, the controller can apply a relatively lower read voltage and determine whether a calculated fail-bit-count exceeds a threshold value. This leakage current can impact the logical values programed to the memory cells of the other blocks, leading to errors and data loss on the memory device. Thus, mechanisms and methods for preventing data loss due to GBB leakage current are desirable.

Aspects of the present disclosure address the above and other deficiencies by implementing a memory sub-system controller capable of performing select gate integrity checks to identify and invalidate defective blocks. In an illustrative example, the memory sub-system controller can perform background scanning operations on each block of the memory device. A scanning operation can include applying a maximum allowable voltage to the drain select line and measuring the voltage (or the current, the impedance, etc.) at one or more select gate drains along the drain select line. If the measured voltage satisfies a threshold criterion (e.g., the voltage measurement being lower than a threshold value), the memory sub-system controller can identify the corresponding block that includes the defective select gate (e.g., the defective select gate is part of the array of the block) and mark the identified block in a GBB data structure. For example, the memory sub-system controller can record the identifier (ID) of the block in the GBB data structure. The memory sub-system controller can then perform a push-up operation to invalidate the data on the block. A push-up operation can include one or more voltage pulses that are applied to the wordlines of the block. The voltage pulses can alter the charge held on the memory cells, causing the programming distributions of the memory cells to overlap and/or collapse, which corrupts the data. The voltage pulses of the push-up operation are lower than an erase operation, and thus, should not leak to from a defective select gate block to adjacent blocks.

In some embodiments, the host system can issue an enhanced erase command (e.g., a sanitize command). For example, the host system can request that the memory sub-system controller perform a sanitize operation to remove particular data from the memory device. In response, the memory sub-system controller can determine whether the block(s) referenced by the sanitize command is a GBB experiencing a select gate low voltage. For example, the memory sub-system controller can perform a lookup of the referenced block in the GBB data structure. Responsive to the memory sub-system controller locating the referenced block in the GBB data structure, the memory sub-system controller can discard the sanitize command, since the block has already been invalidated by the push-up program, and discarding the sanitize command prevents an erase operation leaking current to adjacent blocks. Responsive to the memory sub-system controller failing to locate the referenced block in the GBB data structure, the memory sub-system controller can perform an erase operation on the block. For example, the memory sub-system controller can apply a relatively large negative voltage (e.g., approximately 20V) to repel electrons from the memory cell.

Advantages of the present disclosure include, but are not limited to, an improved performance of the memory sub-system by reducing the number of instances where data is lost due to a select gate leakage current. Since the number of instances are reduced, this can result in an improvement of performance and reliability of the memory sub-system. Although embodiments are described using wordlines of a NAND flash memory, aspects of the present disclosure can be applied to other types of memory sub-systems.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g. 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local controller 132) on the die and a controller (e.g., memory sub-system controller 115) for media management within the same memory device package. An example of a managed memory device is a managed NAND (MNAND) device.

In one embodiment, the memory sub-system 110 includes a media management component 113 that can be used to manage data in the memory device 130 and the memory device 140. In particular, the media management component 113 can perform select gate integrity checks to identify and invalidate defective blocks. In some embodiments, the memory sub-system controller 115 includes at least a portion of the media management component 113. In some embodiments, the media management component 113 is part of the host system 120, an application, or an operating system. In other embodiments, local media controller 135 includes at least a portion of media management component 113 and is configured to perform the functionality described herein. Further details with regards to the operations of the media management component 113 are described below.

Figure 2:
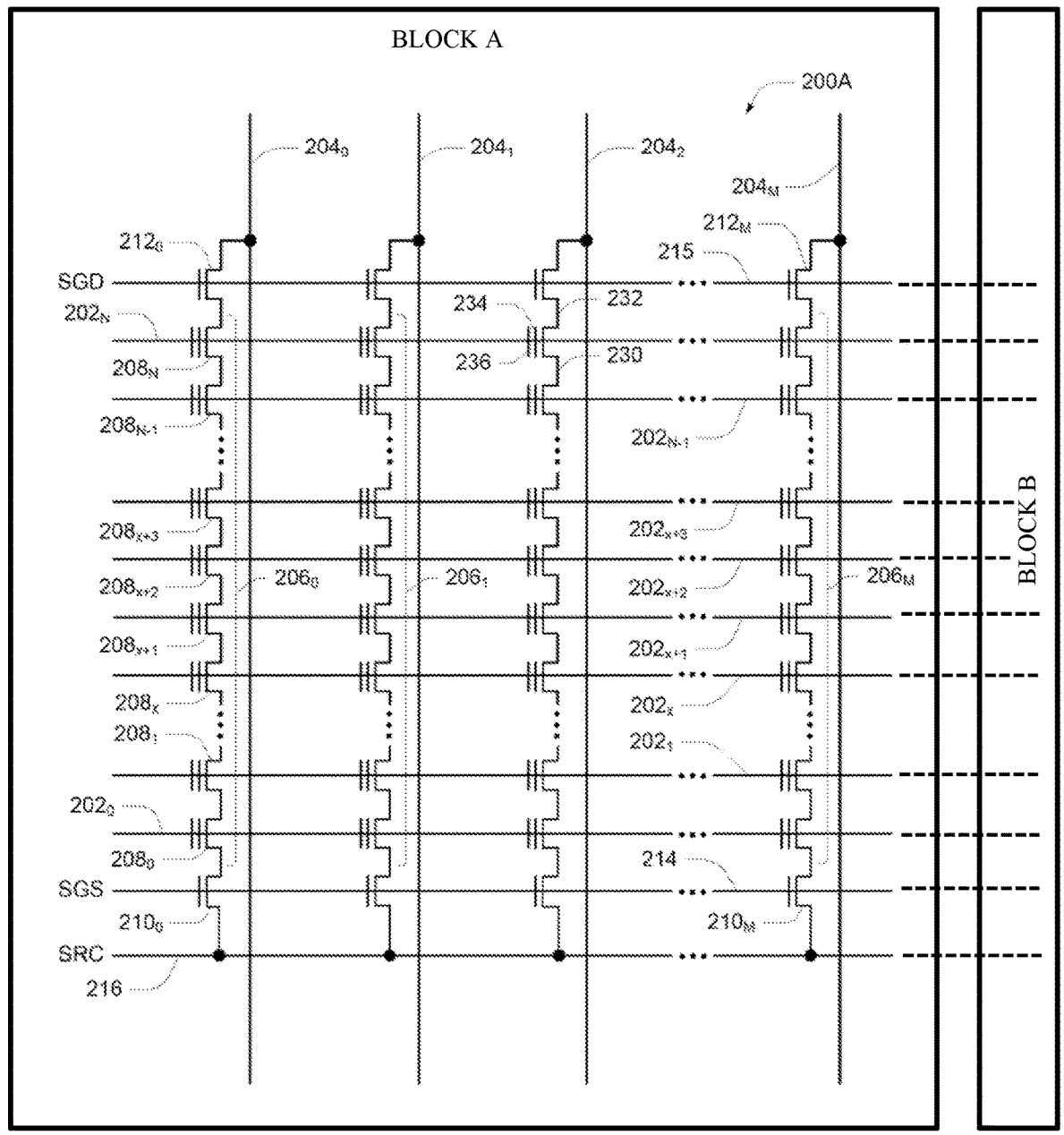
FIG. 2 is a schematic of portions of an array of memory cells as could be used in a memory of the type described with reference to FIG. 1 in accordance with some embodiments of the present disclosure

FIG. 2 is a schematic of portions of an array of memory cells 104, such as a NAND memory array, as could be used in a memory of the type described with reference to FIG. 1 according to an embodiment. Memory array 104 can be part of block A and include access lines, such as wordlines $202_0$ to $202_N$, and data lines, such as bit lines $204_0$ to $204_M$. The wordlines 202 can be connected to global access lines (e.g., global wordlines), not shown in FIG. 2, in a many-to-one relationship. For some embodiments, memory array 104 can be formed over a semiconductor that, for example, can be conductively doped to have a conductivity type, such as a p-type conductivity, e.g., to form a p-well, or an n-type conductivity, e.g., to form an n-well. Block B can be adjacent to block A, and can share one or more access lines.

Memory array 104 can be arranged in rows (each corresponding to a wordline 202) and columns (each corresponding to a bit line 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bit line 204 for the corresponding NAND string 206. For example, the drain of select gate $212_0$ can be connected to the bit line $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bit line 204. A control gate of each select gate 212 can be connected to select line 215.

The memory array 104 in FIG. 2 can be a quasi-two-dimensional memory array and can have a generally planar structure, e.g., where the common source 216, NAND strings 206 and bit lines 204 extend in substantially parallel planes. Alternatively, the memory array 104 in FIG. 2 can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bit line 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bit lines 204 (e.g., bit lines $204_0$, $204_2$, $204_4$, etc.) can be one physical page of the memory cells 208 (e.g., even memory cells) while memory cells 208 commonly connected to wordline $202_N$ and selectively connected to odd bit lines 204 (e.g., bit lines $204_1$, $204_3$, $204_5$, etc.) can be another physical page of the memory cells 208 (e.g., odd memory cells).

Although bit lines $204_3$-$204_5$ are not explicitly depicted in FIG. 2, it is apparent from the figure that the bit lines 204 of the array of memory cells 104 can be numbered consecutively from bit line $204_0$ to bit line $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings 206 sharing common wordlines 202). Unless expressly distinguished, a reference to a page of memory cells herein refers to the memory cells of a logical page of memory cells. Although the example of FIG. 2 is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 3:
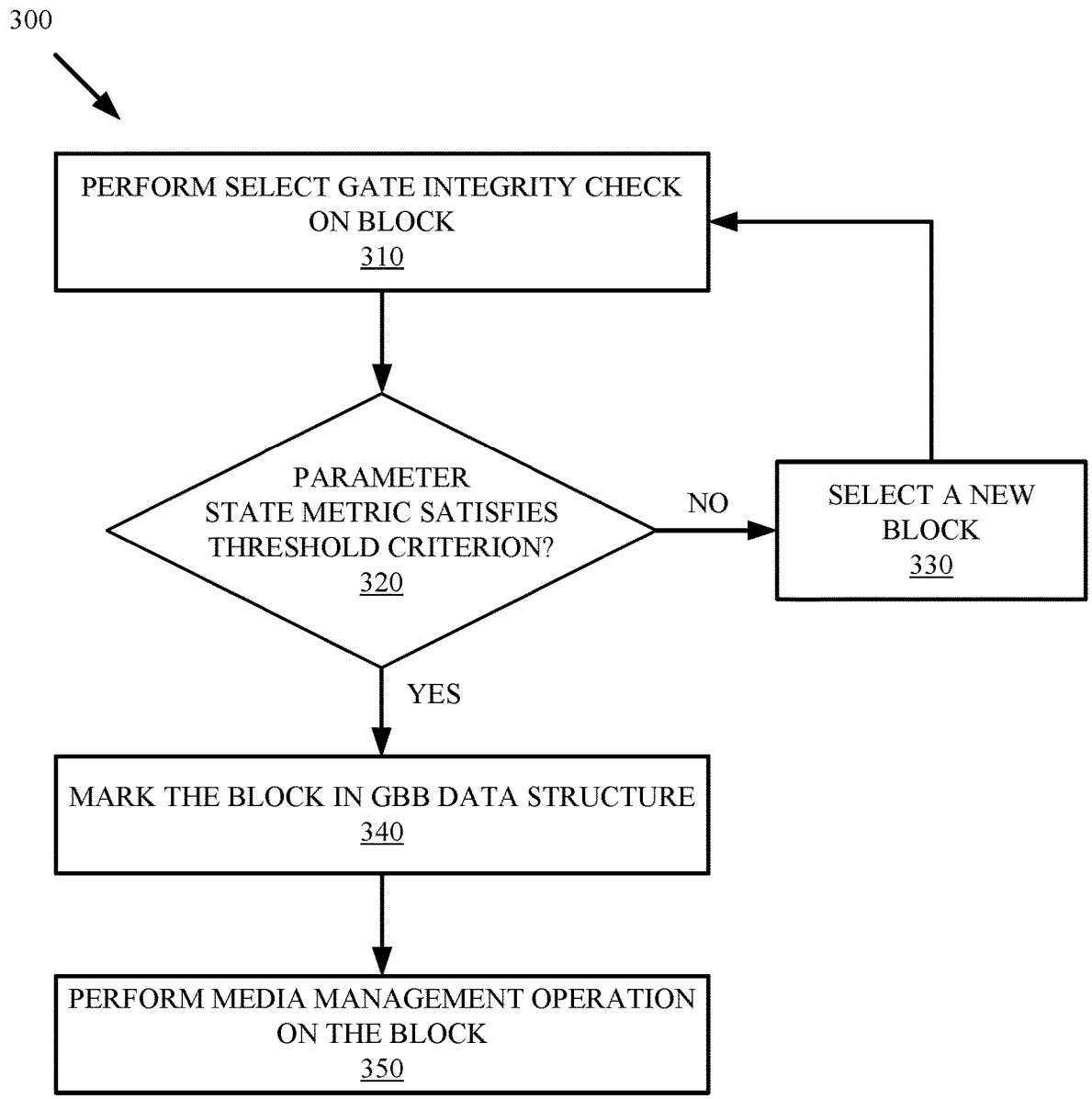
FIG. 3 is a flow diagram of an example method for performing select gate integrity checks to identify and invalidate defective blocks, in accordance with some embodiments of the present disclosure.

FIG. 3 is a flow diagram of an example method 300 for performing select gate integrity checks to identify and invalidate defective blocks, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the media management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing logic performs a select gate integrity check on a block. The select gate integrity check can include identifying a parameter value characterizing one or more select gates (e.g., a select gate source, a select gate drain, etc.) of the block. The processing logic can select one or more select gates from the block based on a sequential order, a pattern (e.g., each odd select gate, each even select gate, each nth select gate, etc.) a randomized order, or any combination thereof. The parameter value can include a voltage value, a current value, etc. For example, the processing logic can apply a maximum allowable voltage to the drain select line and measure the voltage and/or current at one or more select gate drains along the drain select line.

At operation 320, the processing logic determines whether the parameter value satisfies a threshold criterion (e.g., the voltage or current value being lower or higher than a threshold value). For example, the processing logic can determine whether the measured voltage at the select gate drain is lower than a threshold voltage value. Responsive to the parameter value failing to satisfy the threshold criterion (e.g., the measured voltage value exceeding the threshold voltage value), the processing logic proceeds to operation 330, and selects another block. The processing logic then proceeds to operation 310 and performs a select gate integrity check on the newly selected block.

Responsive to determining that the parameter value satisfies the threshold criterion (e.g., the measured voltage value being less than the threshold voltage value), the processing logic proceeds to operation 340.

Figure 4:
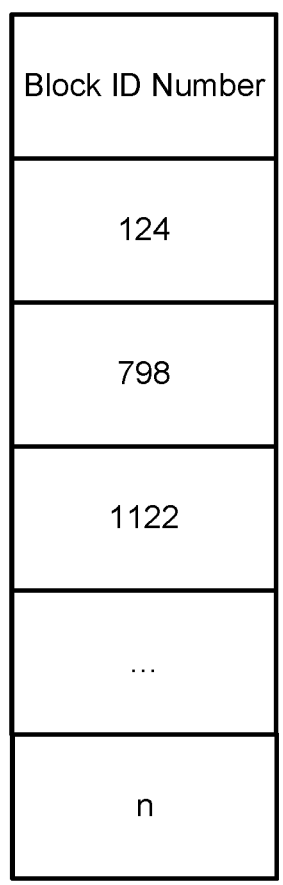
FIG. 4 is a diagram showing a grown bad block data structure, in accordance with some embodiments of the present disclosure.

At operation 340, the processing logic can mark the identified block in a GBB data structure. For example, the processing logic can record the identifier (ID) of the block in the GBB data structure. The GBB data structure can be a metadata table, a look-up table, a database, or any other structure capable of storing a collection of data values, the relationships among them, and the functions or operations that can be applied to the data values. The GBB data structure may include a list of ID numbers for each block that has been identified as a GBB. The GBB data structure can be maintained by the media management component 113 and used to track blocks that have a defective select gate. FIG. 4 shows an illustrative example of GBB data structure 410, which include a listing of block ID numbers (e.g., block 124, block 798, and block 1122) which have been identified as GBBs.

At operation 350 the processing logic can perform a media management operation on the block. In some embodiments, the media management operation includes a push-up operation to invalidate the data on the block. A push-up operation can include applying one or more voltage pulses to the wordlines of a block. The one or more voltage pulses can alter the charge held on the memory cells, causing the programming distributions of the memory cells to overlap. This, in turn, can corrupt the data stored on the memory cells. In other embodiments, the media management operation can further include a folding operation performed prior to the push-up operation. For example, the media management operation can write the data stored at the entire block to an available block of the memory sub-system.

In some embodiments, the processing logic can further retire the block. The retired data block will no longer used to store data by the processing logic. In an example, the processing logic can mark the block as retired in a look-up table, a data structure, etc.

Figure 5:
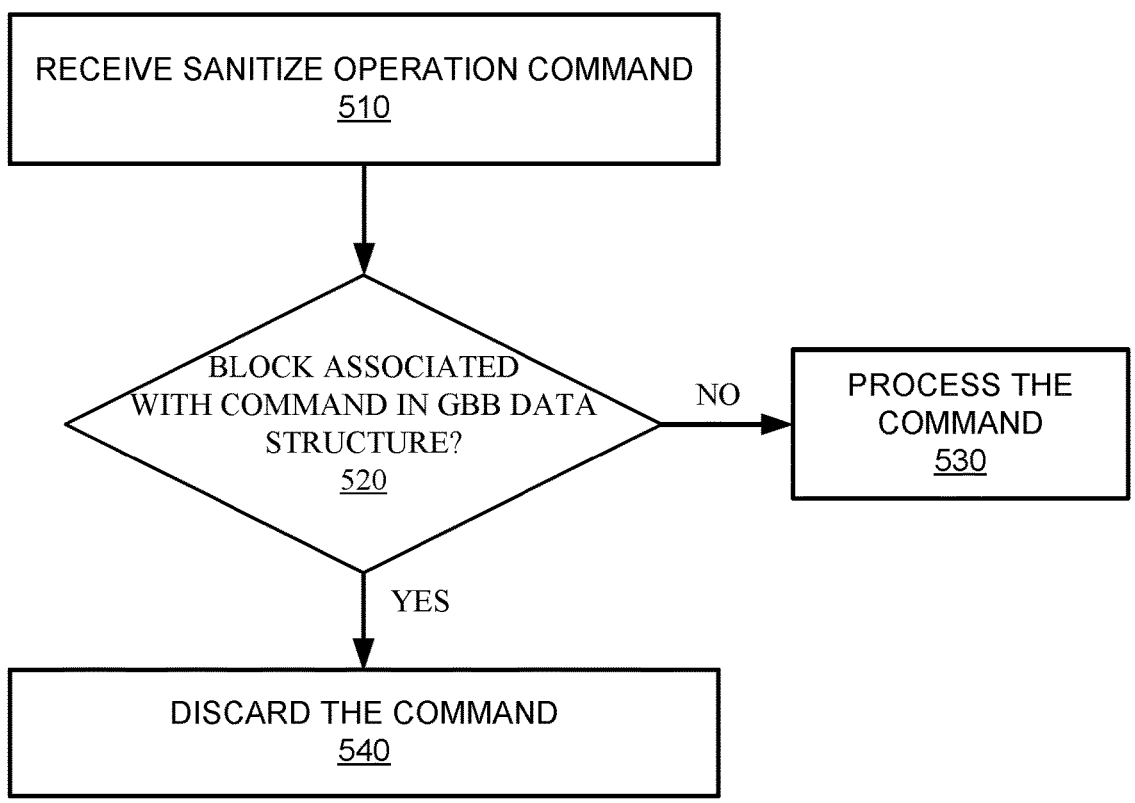
FIG. 5 is a flow diagram of an example method for processing an enhanced erase command, in accordance with some embodiments of the present disclosure.

FIG. 5 is a flow diagram of an example method 500 for processing an enhanced erase command, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the media management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic can receive an enhanced erase command from the host system. In some embodiments, the enhanced erase command can be a sanitize command. The enhanced erase command can reference particular data or a particular block(s) on which an erase operation is to be performed. In some embodiments, the processing logic can use a look-up table to identify which block(s) is associated with the data referenced by the enhanced erase command.

At operation 520, the processing logic can determine whether the referenced (or identified) block is a GBB experiencing a select gate low voltage. For example, the memory sub-system controller can perform a lookup of the referenced block in the GBB data structure. Responsive to failing to locate the referenced block in the GBB data structure, the processing logic can proceed to operation 530. At operation 530, the processing logic can perform an erase operation on the block. For example, the processing logic can apply a negative voltage (e.g., approximately 20V) to repel electrons from the memory cells of the block.

Responsive to locating the referenced block in the GBB data structure, the processing logic proceeds to operation 540. At operation 540, the processing logic can discard the enhanced erase command, thus preventing an erase operation leaking current to adjacent blocks.

Figure 6:
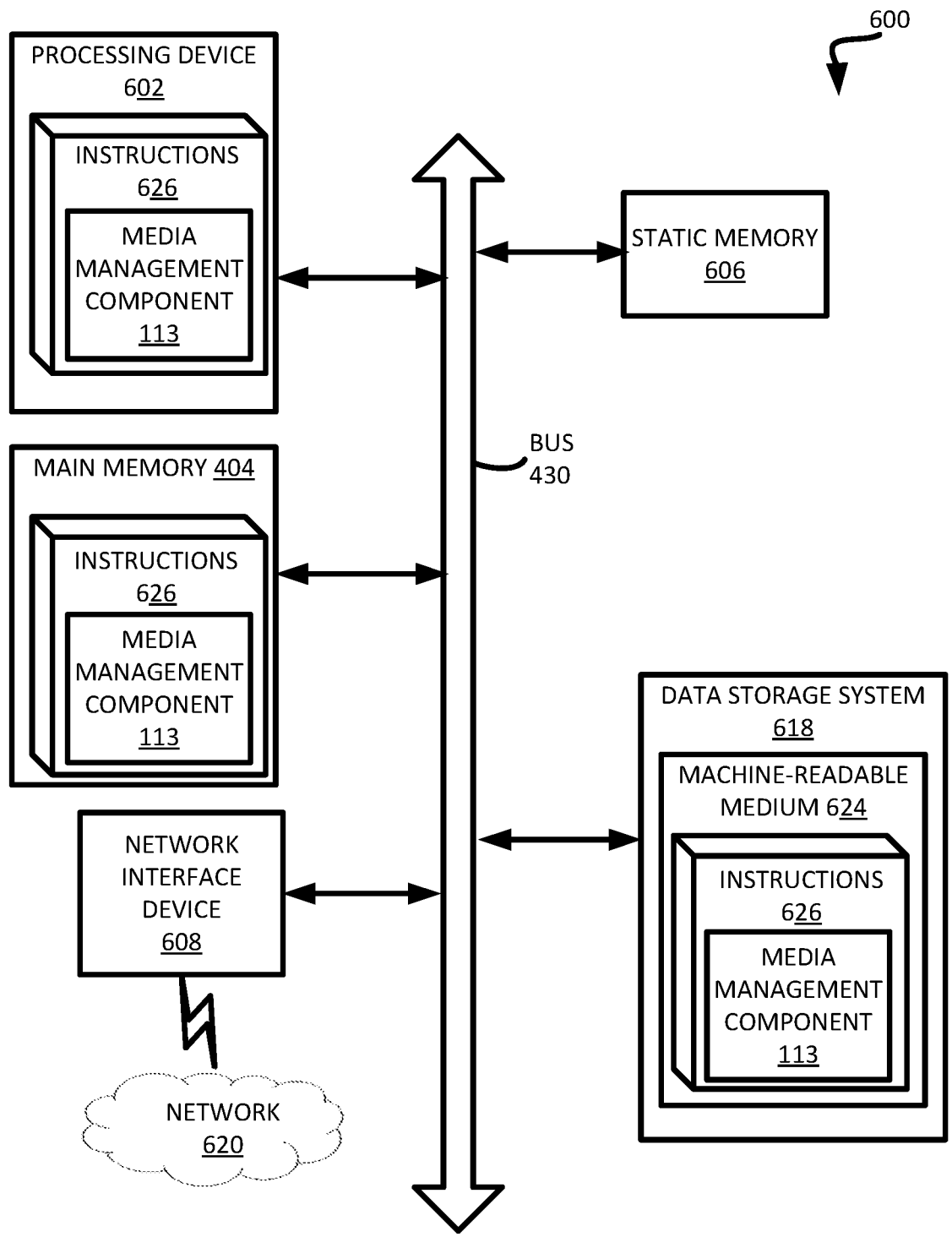
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes or utilizes a memory sub-system (e.g., the memory sub-system 110 of FIG. 1) or can be used to perform the operations of a controller (e.g., to execute an operating system to perform operations corresponding to media management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630. Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to media management component 113 of FIG. 1. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled to the memory device, to perform operations comprising:
receiving, from a host system, an enhanced erase command referencing a block;
performing a lookup to determine whether the block is marked in a grown bad block (GBB) data structure used to track blocks that have a defective select gate, wherein blocks are marked in the GBB data structure in response to determining that a parameter value satisfies a threshold criterion, wherein the parameter value is determined by applying a maximum allowable voltage to a drain select line and measuring a voltage at a select gate; and
responsive to determining that the block is marked in the GBB data structure, discarding the enhanced erase command.

2. The system of claim 1, wherein the processing device is to perform further operations comprising:
responsive to determining that the block is not marked in the GBB data structure, performing an erase command on the block.

3. The system of claim 1, wherein the processing device is to perform further operations comprising:
responsive to determining that the parameter value satisfies the threshold criterion, marking another block in the GBB data structure.

4. The system of claim 3, wherein the processing device is to perform further operations comprising:
responsive to determining that the parameter value satisfied the threshold criterion, performing a folding operation on the another block.

5. The system of claim 3, wherein the processing device is to perform further operations comprising:
responsive to determining that the parameter value satisfied the threshold criterion, retiring the another block from further use by the memory device.

6. The system of claim 3, wherein the processing device is to perform further operations comprising:
performing one or more pulse operations on the another block to invalidate data stored on the another block, wherein the one or more pulse operations cause programming distributions of memory cells comprised by the block to overlap.

7. The system of claim 3, wherein the parameter value comprises at least one of a voltage value, a current value, or an impedance value.

8. A method, comprising:
 receiving, by a processor, from a host system, an enhanced erase command referencing a block;
 performing a lookup to determine whether the block is marked in a grown bad block (GBB) data structure used to track blocks that have a defective select gate, wherein blocks are marked in the GBB data structure in response to determining that a parameter value satisfies a threshold criterion, wherein the parameter value is determined by applying a maximum allowable voltage to a drain select line and measuring a voltage at a select gate; and
 responsive to determining that the block is marked in the GBB data structure, discarding the enhanced erase command.

9. The method of claim 8, further comprising: responsive to determining that the block is not marked in the GBB data structure, performing an erase command on the block.

10. The method of claim 8, further comprising:
 responsive to determining that the parameter value satisfies the threshold criterion, marking another block in the GBB data structure.

11. The method of claim 10, further comprising:
 responsive to determining that the parameter value satisfied the threshold criterion, performing a folding operation on the another block.

12. The method of claim 10, further comprising:
 responsive to determining that the parameter value satisfied the threshold criterion, retiring the another block from further use by a memory device.

13. The method of claim 10, further comprising:
 performing one or more pulse operations on the another block to invalidate data stored on the another block, wherein the one or more pulse operations cause programming distributions of memory cells comprised by the block to overlap.

14. The method of claim 10, wherein the parameter value comprises at least one of a voltage value, a current value, or an impedance value.

15. A non-transitory computer-readable storage medium comprising instructions that, when executed by a processing device operatively coupled to a memory, performs operations comprising:
 receiving, from a host system, an enhanced erase command referencing a block;
 performing a lookup to determine whether the block is marked in a grown bad block (GBB) data structure used to track blocks that have a defective select gate, wherein blocks are marked in the GBB data structure in response to determining that a parameter value satisfies a threshold criterion, wherein the parameter value is determined by applying a maximum allowable voltage to a drain select line and measuring a voltage at a select gate; and
 responsive to determining that the block is marked in the GBB data structure, discarding the enhanced erase command.

16. The non-transitory computer-readable storage medium of claim 15, wherein the processing device to perform further operations comprising:
 responsive to determining that the block is not marked in the GBB data structure, performing an erase command on the block.

17. The non-transitory computer-readable storage medium of claim 15, wherein the processing device to perform further operations comprising:
 responsive to determining that the parameter value satisfies the threshold criterion, marking another block in the GBB data structure.

18. The non-transitory computer-readable storage medium of claim 17, wherein the processing device to perform further operations comprising:
 responsive to determining that the parameter value satisfied the threshold criterion, performing a folding operation on the another block.

19. The non-transitory computer-readable storage medium of claim 17, wherein the processing device to perform further operations comprising:
 responsive to determining that the parameter value satisfied the threshold criterion, retiring the another block from further use by a memory device.

20. The non-transitory computer-readable storage medium of claim 17, wherein the processing device to perform further operations comprising:
 performing one or more pulse operations on the another block to invalidate data stored on the another block, wherein the one or more pulse operations cause programming distributions of memory cells comprised by the block to overlap.

* * * * *